United States Patent
You (10) Patent No.: US 9,276,020 B2
(45) Date of Patent: Mar. 1, 2016

(54) DISPLAY DEVICE AND METHOD OF MANUFACTURING THE SAME

(71) Applicant: Samsung Display Co., LTD., Yongin, Gyeonggi-Do (KR)

(72) Inventor: Chun-Gi You, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 115 days.

(21) Appl. No.: 14/092,631

(22) Filed: Nov. 27, 2013

(65) Prior Publication Data

US 2014/0087494 A1 Mar. 27, 2014

Related U.S. Application Data

(62) Division of application No. 13/017,362, filed on Jan. 31, 2011, now Pat. No. 8,624,246.

(30) Foreign Application Priority Data

Apr. 5, 2010 (KR) ........................ 10-2010-0030921

(51) Int. Cl.
*H01L 21/00* (2006.01)
*H01L 27/12* (2006.01)

(52) U.S. Cl.
CPC ........ *H01L 27/1288* (2013.01); *H01L 27/1255* (2013.01)

(58) Field of Classification Search
CPC .......................... H01L 27/1255; H01L 27/1288
USPC ........................................................ 438/23
See application file for complete search history.

(56) References Cited

U.S. PATENT DOCUMENTS

| 6,927,464 | B2 | 8/2005 | Kim et al. |
| 7,488,979 | B2 | 2/2009 | Oh et al. |
| 7,508,037 | B2 | 3/2009 | Kim et al. |
| 7,804,572 | B2 | 9/2010 | Park et al. |
| 2004/0001168 | A1 | 1/2004 | Koide |
| 2005/0218407 | A1 | 10/2005 | Matsuura et al. |
| 2005/0285197 | A1 | 12/2005 | Park |
| 2006/0145162 | A1* | 7/2006 | Yang .............................. 257/72 |
| 2006/0226441 | A1 | 10/2006 | Seo et al. |
| 2006/0286698 | A1 | 12/2006 | Kurashina |

(Continued)

FOREIGN PATENT DOCUMENTS

| KR | 1019990026576 | 2/2001 |
| KR | 1020050081542 A | 8/2005 |

(Continued)

*Primary Examiner* — Minh-Loan Tran
*Assistant Examiner* — Farid Khan
(74) *Attorney, Agent, or Firm* — Robert E. Bushnell, Esq.

(57) ABSTRACT

A display device and a method of manufacturing the same. In one embodiment, a display device includes a substrate having a pixel region, a transistor region and a capacitor region, a transistor arranged within the transistor region of the substrate and a capacitor arranged within the capacitor region of the substrate, wherein the capacitor includes a lower electrode arranged on the substrate, a gate insulating layer arranged on the lower electrode and an upper electrode arranged on the gate insulating layer and overlapping the lower electrode, the upper electrode includes a first conductive layer and a second conductive layer arranged on the first conductive layer, wherein the first conductive layer is opaque.

20 Claims, 5 Drawing Sheets

(56) References Cited

U.S. PATENT DOCUMENTS

| | | |
|---|---|---|
| 2007/0247558 A1 | 10/2007 | Lin |
| 2007/0269936 A1 | 11/2007 | Tanaka et al. |
| 2007/0284586 A1 | 12/2007 | Park et al. |
| 2008/0001155 A1 | 1/2008 | Jung et al. |
| 2008/0002084 A1* | 1/2008 | Park et al. .................. 349/43 |
| 2008/0258196 A1* | 10/2008 | Chen ........................ 257/296 |
| 2008/0315189 A1* | 12/2008 | Lee et al. ..................... 257/40 |
| 2009/0104737 A1 | 4/2009 | Sato et al. |
| 2009/0227054 A1 | 9/2009 | Cheng |
| 2010/0193790 A1 | 8/2010 | Yeo et al. |
| 2011/0133666 A1 | 6/2011 | Arai |
| 2011/0140107 A1* | 6/2011 | Kang et al. .................. 257/57 |
| 2011/0266545 A1 | 11/2011 | Won et al. |
| 2011/0309363 A1 | 12/2011 | Misaki |

FOREIGN PATENT DOCUMENTS

| | | |
|---|---|---|
| KR | 1020060067050 A | 6/2006 |
| KR | 10-0867926 B1 | 11/2008 |
| KR | 1020090059843 A | 11/2009 |
| KR | 1020090120698 | 11/2009 |

* cited by examiner

DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 5 Apr. 2010 and there duly assigned Serial No. 10-2010-0030921. Furthermore, this application is filed pursuant to 35 U.S.C. §121 as a Divisional application of Applicants' patent application Ser. No. 13/017,362 filed in the U.S. Patent & Trademark Office on 31 Jan. 2011, and assigned to the assignee of the present invention. All benefits accruing under 35 U.S.C. §120 from the aforesaid present application Ser. No. 13/017,362 are also claimed.

BACKGROUND OF THE INVENTION

1. Field of the Invention

An aspect of the present invention relates to a display device including a thin film transistor and a capacitor where ions can be implanted without requiring a separate mask, and a method of manufacturing the display device.

2. Description of the Related Art

As demands on various types of display devices have recently been increased with the development of information society, studies on flat panel display devices such as a liquid crystal display device (LCD), a plasma display panel (PDP), a field emission display device (FED), an electrophoretic display device (EPD) and an organic light emitting display device (OLED) have been actively conducted.

The LCD is a flat panel display device using electrical-optical properties of liquid crystals, and is classified into a passive matrix type and an active matrix type. The active matrix type has a superior resolution and ability of implementing moving images over that of the passive matrix type. Hence, the active matrix type is frequently used.

An active matrix type LCD includes a transistor for driving a unit pixel and a capacitor, and the transistor and the capacitor are provided with an active layer and a lower electrode, respectively. Ions are implanted into the active layer of the transistor and the lower electrode of the capacitor, and an ion implanting process is separately performed with respect to the transistor and the capacitor.

Since the ion implantation process is performed with respect to only the lower electrode of the capacitor separately from the ion implantation process of the transistor, the number of masks and processes needed for ion implantation are significant. This increase in masks and process steps due to ion implantation results in an increase in the cost to manufacture the display device and a decrease in manufacturing yield.

SUMMARY OF THE INVENTION

In embodiments, there is provided a display device capable of reducing manufacturing cost and simplifying processes.

In embodiments, there is provided a method of manufacturing the display device.

According to an aspect of the present invention, there is provided a display device including a substrate having a pixel region, a transistor region and a capacitor region, a transistor arranged within the transistor region of the substrate and a capacitor arranged within the capacitor region of the substrate, wherein the capacitor includes a lower electrode arranged on the substrate, a gate insulating layer arranged on the lower electrode and an upper electrode arranged on the gate insulating layer and overlapping the lower electrode, the upper electrode includes a first conductive layer and a second conductive layer arranged on the first conductive layer, wherein the first conductive layer is opaque.

The lower electrode of the capacitor may include of a silicon layer doped with impurity ions, the silicon layer being one of amorphous silicon or poly-silicon. The first conductive layer of the upper electrode may include an impurity. The transistor may include a gate electrode that includes a second conductive layer arranged on a first conductive layer, the first conductive layer comprising an impurity and a concentration of the impurity within the first conductive layer of the gate electrode may be lower than that of the concentration of the impurity within the first conductive layer of the lower electrode. The first conductive layer of the upper electrode may have a thickness of about 200 to 700 Å. The first conductive layer of the upper electrode may include one of chrome and molybdenum. The second conductive layer of the upper electrode may be arranged on at least a portion of the first conductive layer. The one portion may be an edge portion. The second conductive layer of the upper electrode may be arranged on opposite edge portions of the first conductive layer of the upper electrode. The second conductive layer of the upper electrode may include one of a metal and a metal alloy. The upper electrode may be arranged on a same layer as the gate electrode of the transistor.

According to an aspect of the present invention, there is provided a method of manufacturing a display device that includes providing a substrate having a transistor region, a pixel region and a capacitor region, forming an active layer on the substrate in the transistor region, forming a lower electrode on the substrate in the capacitor region, sequentially forming a gate insulating layer, an opaque first conductive layer and a second conductive layer on the substrate on which the active layer and the lower electrode are formed, forming a gate electrode and an upper electrode in the transistor region and the capacitor region respectively by patterning the first and second conductive layers, implanting a plurality of first impurity ions into the active region using the gate electrode as a mask, forming an interlayer insulating layer that exposes a portion of the second conductive layer of the upper electrode while simultaneously exposing portions of the active layer at opposite sides of the gate electrode, forming source and drain electrodes electrically connected to the exposed portions of the active layer while simultaneously exposing the first conductive layer of the upper electrode by removing the exposed portion of the second conductive layer of the upper electrode and implanting second impurity ions into the lower electrode through the exposed first conductive layer of the upper electrode.

The lower electrode may include one of amorphous silicon and poly-silicon. The first conductive layer of the upper electrode may have a thickness of about 200 to 700 Å. The first conductive layer of the upper electrode may include one of chrome and molybdenum. Portions of the second conductive layer of the upper electrode remain at opposite edges of the first conductive layer of the upper electrode upon the removing of the exposed portion of the second conductive layer. The second conductive layer of the upper electrode may include one of a metal and a metal alloy. The upper electrode may be arranged on a same layer as a gate line. The upper electrode may be arranged on a same layer as the gate electrode.

According to yet another aspect of the present invention, there is provided a method of manufacturing a display device that includes providing a substrate having a pixel region, a transistor region and a capacitor region, forming a silicon layer on an entire surface of the substrate, the silicon layer including a material selected from a group consisting of polysilicon and amorphous silicon, forming an active layer and a lower electrode in the transistor region and the capacitor region respectively by patterning the silicon layer using a first mask, sequentially forming a gate insulating layer, an opaque first conductive layer and a second conductive layer on the substrate on which the active layer and the lower electrode are formed, forming a gate electrode and an upper electrode in the transistor region and the capacitor region respectively by patterning the first and second conductive layers using a second mask, implanting a plurality of first impurity ions into portions of the active layer, forming an interlayer insulating layer on an entire surface of the substrate, exposing portions of the active layer implanted with the first impurity ions while exposing the second conductive layer of the upper electrode by patterning the interlayer insulating layer using a third mask, forming a third conductive layer on an entire surface of the substrate, forming source and drain electrodes electrically connected to the exposed portions of the active layer while simultaneously exposing the first conductive layer of the upper electrode by patterning the third conductive layer using a fourth mask while removing a portion of the second conductive layer of the upper electrode and implanting a plurality of second impurity ions into the lower electrode through the exposed first conductive layer of the upper electrode.

The first conductive layer of the upper electrode may have a thickness of about 200 to 700 Å. The first conductive layer of the upper electrode may include one of chrome and molybdenum. The gate electrode and the upper electrode may include a same material and be arranged on a same layer as a gate line.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE INVENTION

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Hereinafter, a display device and a method of manufacturing the same according to an embodiment of the present invention will be described in detail with respect to the accompanying drawings. i) Shapes, sizes, rates, angles, numbers and the like illustrated in the accompanying drawings are illustrative, and may be modified to some extent. ii) Since the drawings are illustrated at observer's sight, directions or positions in which the drawings are described may be variously modified depending on observer's positions. iii) Like reference numerals may be used to indicate like parts throughout the drawings. iv) When the terms 'comprise', 'have', 'include' and the like are used, other parts may be added as long as the term 'only' is not used. v) The singular forms may be interpreted as the plural forms. vi) Although the terms 'about', 'substantially' and the like are not used, shapes, comparisons between sizes, relations between positions, and the like are interpreted to include an ordinary error range. vii) Although the terms 'after', 'before', 'subsequently', 'also', 'here', 'at this time' and the like are used, they are not used to limit temporal positions. viii) The terms 'first', 'second', 'third' and the like are selectively, mutually or repeatedly used for distinguishing between similar elements and not used as confined meanings. ix) When the position relation between two parts is described using the terms 'on', 'above', 'below', 'next' and the like, one or more parts may be positioned between the two parts as long as the term 'immediately' is not used. x) When parts are linked by the term 'or', they are interpreted individually or in combination, but when they are linked by the term 'or one of', they are only interpreted individually.

Display Device

Figure 1:
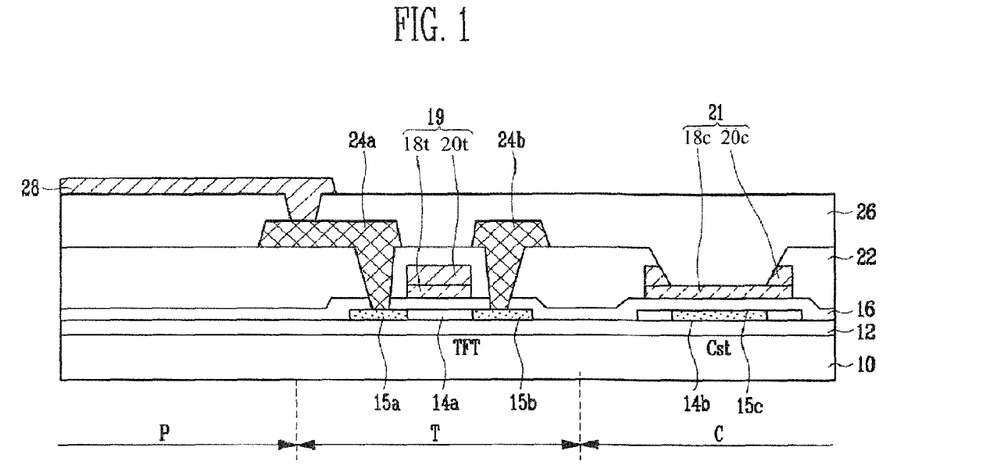
FIG. 1 is a sectional view of a display device according to an embodiment of the present invention.

Turning now to FIG. 1, FIG. 1 is a sectional view of a display device according to an embodiment of the present invention. In the embodiment shown in FIG. 1, a display device of a twisted nematic (TN) mode, a vertical alignment (VA) mode or the like is implemented as an example. For convenience of illustration, a substrate on which one sub-pixel including a transistor and a capacitor is defined will be shown in FIG. 1. However, embodiments of the present invention may be used for all kinds of display devices including an organic light emitting display device and the like.

Referring to FIG. 1, the display device according to the embodiment of the present invention includes a substrate 10 defined by a pixel region P, a transistor region T and a capacitor region C, and a thin film transistor (TFT) and a capacitor Cst positioned on the substrate 10 in the transistor region T and the capacitor region Cst respectively.

The TFT includes an active layer 14a formed on the substrate 10, a gate insulating layer 16 formed on the active layer 14a, a gate electrode 19, a source electrode 24a and a drain electrode 24b.

The active layer 14a forms a conductive channel between the source and drain electrodes 24a and 24b and applies a voltage supplied to the source electrode 24a to the drain electrode 24b when a gate signal is supplied to the gate electrode 19. To this end, the active layer 14a includes a source region 15a doped with impurities and connected to the source electrode 24a and a drain region 15b doped with impurities and connected to the drain electrode 24b. The active layer 14a includes amorphous silicon or poly-silicon, and is positioned on the substrate 10.

The gate electrode 19 is positioned on the active layer 14a with the gate insulating layer 16 interposed therebetween. The gate electrode 19 is electrically connected to a gate line (not shown), and receives a gate signal from the gate line. The gate electrode 19 has a stacked structure of first and second conductive layers 18t and 20t. The gate electrode 19 is made out of the same material and resides on a same layer as an upper electrode 21 of the capacitor Cst.

The source and drain electrodes 24a and 24b are positioned on an interlayer insulating layer 22 formed on the entire surface of the substrate 10 having the gate electrode 19 formed thereon. The source electrode 24a is connected to the source region 15a of the active layer 14a exposed through one opening of the interlayer insulating layer 22, and the drain electrode 24b is connected to the drain region 15b of the active layer 14a exposed through another opening of the interlayer insulating layer 22. One of the drain electrode 24b and the source electrode 24a are electrically connected to an electrode 28 formed in the pixel region P.

When the display device according to the embodiment of the present invention is a liquid crystal display device, the electrode 28 is used as an electrode to apply a voltage to liquid crystals (not shown). On the other hand, when the display device according to the embodiment of the present invention is an organic light emitting display device, the electrode 28 is used as an anode or cathode.

The capacitor Cst is formed so that a lower electrode 14b and the upper electrode 21 overlap each other with the gate insulating layer 16 interposed therebetween. At this time, the gate insulating layer 16 is used as a dielectric. The lower electrode 14b of the capacitor Cst is formed by implanting impurity ions into a semiconductor such as amorphous silicon or poly-silicon, allowing the display device to be driven at a low voltage.

The upper electrode 21 of the capacitor Cst has a stacked structure of first and second conductive layers 18c and 20c. The first conductive layer 18c is made out of an opaque conductive material. For example, the first conductive layer 18c may be made out of chrome (Cr) or molybdenum (Mo).

In this embodiment, when the upper electrode 21 of the capacitor Cst is formed, an opaque conductive layer with low resistance rather than a transparent conductive layer with high resistance is used, allowing the upper electrode 21 of the capacitor Cst to be simultaneously formed with the gate line (not shown). Also, the opaque conductive material with low resistance of the first conductive layer 18c provides a lower entire resistance of the upper electrode 21. Thus, the thickness of the second conductive layer 20c formed on the first conductive layer 18c can be decreased.

When the thickness of the first conductive layer 18c is below about 200 Å, the resistance of the upper electrode 21 is not sufficiently lowered. When the thickness of the first conductive layer 18c is over about 700 Å, it is not easy to perform impurity ion implantation through the first conductive layer 18c. Therefore, in this embodiment, the first conductive layer 18c is formed to a thickness of about 200 to 700 Å so that impurity ions can be easily implanted into the lower electrode 14b through the first conductive layer 18c.

Here, the impurity ion implantation is performed by passing ions through the first conductive layer 18c of upper electrode 21, and as a result, some of these impurities may remain in the first conductive layer 18c of upper electrode 21. In contrast, very few impurities contained within impurity doping region 15c of lower electrode 14b are present in the first conductive layer 18t of gate electrode 19 of transistor region T. This is because the second conductive layer 20t included in the gate electrode 19 serves as an ion implantation mask.

On the other hand, a greater portion of impurities contained within impurity doping region 15c of the lower electrode 14b exists within the first conductive layer 18c of the upper electrode 21. This is because the impurities are implanted into the impurity doping region 15c of the lower electrode 14b by passing through the first conductive layer 18c.

That is, if the first conductive layer 18t of the gate electrode 19 has impurities with a first concentration, the first conductive layer 18c of the upper electrode 21 may contain impurities with a second and greater concentration.

The second conductive layer 20c of the upper electrode 21 is positioned on at least a portion of the first conductive layer 18c. As an example, the second conductive layer 20c of the upper electrode 21 may be positioned on one edge of the first conductive layer 18c. As another example, the second conductive layer 20c of the upper electrode 21 may be positioned on opposite edges of the first conductive layer 18c. Unlike the transistor region T, the second conductive layer 20c of the upper electrode 21 of capacitor region C is not positioned above the impurity doping region 15c of the lower electrode 14b. The second conductive layer 20c of the upper electrode 21 is made out of the same metal or alloy as the second conductive layer 20t of the gate electrode 19.

Meanwhile, the display device according to the embodiment of the present invention may further include a buffer layer 12 formed on the substrate 10 so as to prevent etching damage, and a passivation layer 26 for protecting the TFT and the capacitor Cst.

Method of Manufacturing Display Device

Hereinafter, a method of manufacturing a display device according to an embodiment of the present invention will be illustrated with reference to FIGS. 2A to 2I. Turning now to FIGS. 2A to 2I, FIGS. 2A to 2I are sectional views illustrating a method of manufacturing the display device shown in FIG. 1 according to an embodiment of the present invention.

Figure 2A:
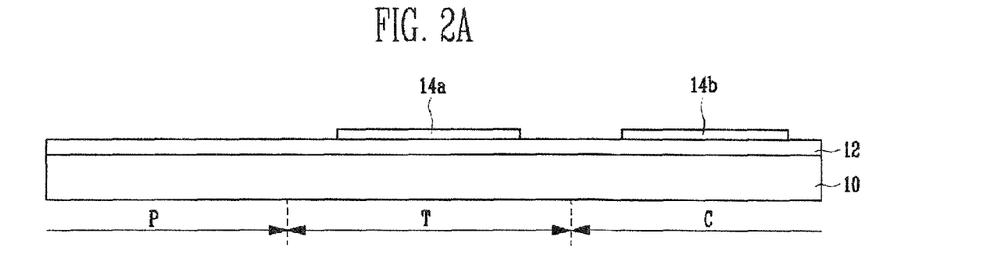
FIGS. 2A to 2I are sectional views illustrating a method of manufacturing the display device shown in FIG. 1 according to an embodiment of the present invention.

Referring to FIG. 2A, a substrate 10 is provided and having a transistor region T, a capacitor region C and a pixel region P. An active layer 14a is formed in a transistor region T of a substrate 10 and a material for lower electrode 14b is formed in the capacitor region C. Before the active layer 14a and the lower electrode 14b are completed, a buffer layer 12 for etching prevention may be further formed on the entire surface of the substrate 10.

The active layer 14a in the transistor region T and the lower electrode 14b in the capacitor region C are formed by depositing amorphous silicon or poly-silicon on the entire surface of the substrate 10 and then patterning it through a photolithography process using a first mask. If necessary, a crystallization process may be performed.

Figure 2B:
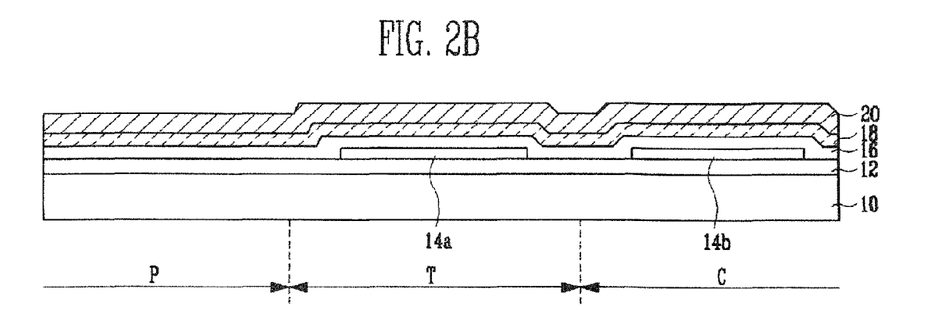

Referring to FIG. 2B, a gate insulating layer 16 is formed on the entire surface including the active layer 14a and the lower electrode 14b. Subsequently, first and second conductive layers 18t/18c and 20t/20c are sequentially formed on the gate insulating layer 16.

The gate insulating layer 16 may be made out of silicon oxide, silicon nitride or silicon oxynitride. The first conductive layers 18t/18c are made out of an opaque conductive layer with low resistance so as to be used in a gate line (not shown). The second conductive layer 20t/20c are made out of a metal such as tungsten (W), titanium (Ti), Molybdenum (Mo), silver (Ag), tantalum (Ta), aluminum (Al), copper (Cu), gold (Au), chrome (Cr), niobium (Nb), or an alloy thereof.

Figure 2C:
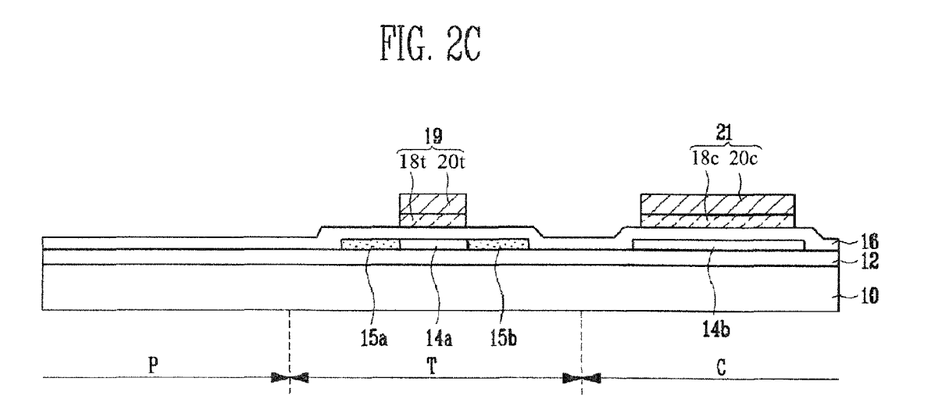

Referring to FIG. 2C, the first and second conductive layers 18t/18c and 20t/20c are patterned through a photolithography process using a second mask to produce gate electrode 19 in the transistor region T and upper electrode 21 in the capacitor region C.

In this embodiment, when the upper electrode 21 of a capacitor Cst is formed, an opaque conductive layer with low resistance is used rather than a transparent conductive layer such as ITO for the first conductive layer 18c, so that the upper electrode of the capacitor Cst can be produced simultaneously with the gate line (not shown). That is, it is possible to fundamentally solve the problem of signal delay generated when ITO is used. Also, the opaque conductive layer with low resistance is used as the first conductive layer 18c, so that the entire resistance of the upper electrode 21 can be lowered. Thus, the thickness of the second conductive layer 20c formed on the first conductive layer 18c can be decreased.

When the thickness of the first conductive layer 18c is below about 200 Å, the resistance of the upper electrode 21 is not sufficiently lowered. When the thickness of the first conductive layer 18c is over about 700 Å, it is not possible to perform impurity ion implantation in a subsequent process through the first conductive layer 18c. Therefore the first conductive layer 18c is formed to a thickness of about 200 to 700 Å so that the impurity ion implantation can be easily performed into the lower electrode 14b through the first conductive layer 18c.

The gate electrode 19 is formed to overlap with a center region of the active layer 14a. At this time, first impurity ions are implanted into opposite edges of the active layer 14a using the gate electrode 19 as a mask, thereby forming source and drain regions 15a and 15b.

Figure 2D:
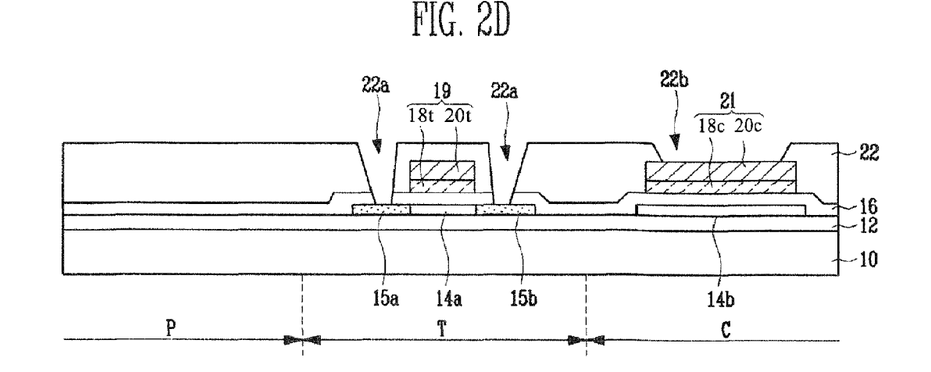

Referring to FIG. 2D, an interlayer insulating layer 22 is formed on the substrate 10 on which the gate electrode 19 and the upper electrode 21 are formed. Subsequently, the interlayer insulating layer 22 and the gate insulating layer 16 are patterned through a photolithography process using a third mask, thereby forming first openings 22a through which the source and drain regions 15a and 15b of the active layer 14a are exposed, respectively. Simultaneously, the interlayer insulating layer 22 in the capacitor region C is patterned through the photolithography process using the third mask, thereby forming a second opening 22b through which the second conductive layer 20c is exposed.

Figure 2E:
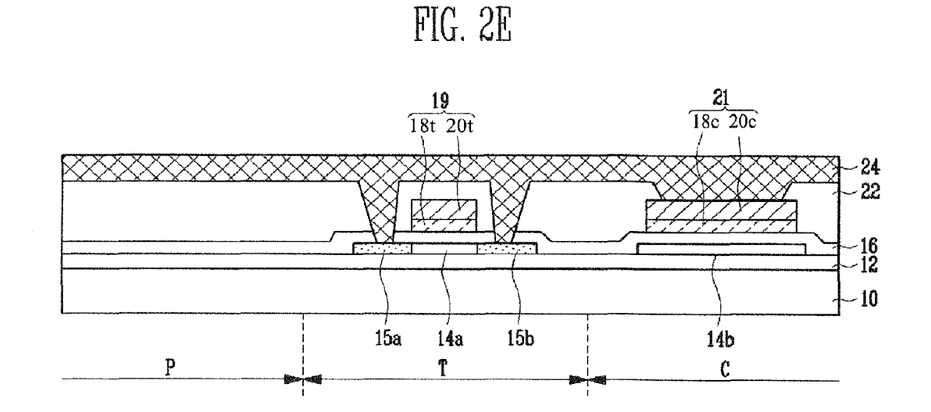

Referring to FIG. 2E, a third conductive layer 24 is formed on the patterned interlayer insulating layer 22 to fill the first and second openings 22a and 22b. A metal or a metal alloy may be used as the third conductive layer 24, such as molybdenum (Mo) or molybdenum tungsten (MoW).

Figure 2F:
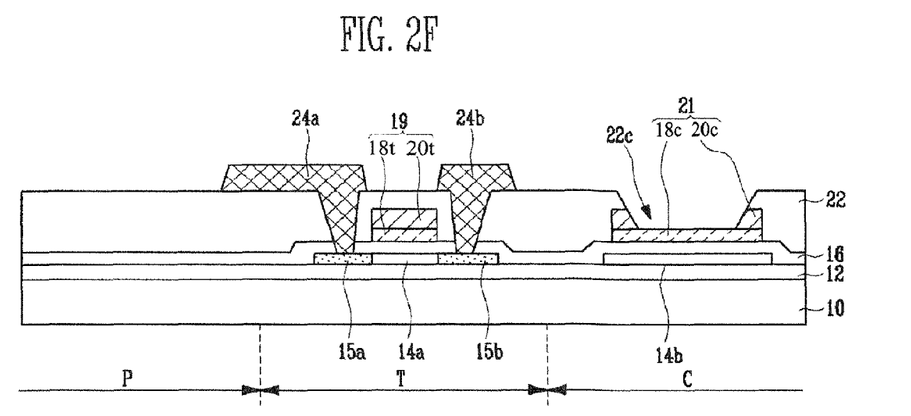

Referring to FIG. 2F, third conductive layer 24 is patterned to produce source and drain electrodes 24a and 24b in transistor region T simultaneous with third opening 22c in capacitor region C. Third opening 22c is formed to expose the first conductive layer 18c of the upper electrode 21 by etching away not only third conductive layer 24 in capacitor region C, but also etching second conductive layer 20c.

Specifically, the third conductive layer 24 is patterned through a photolithography process using a fourth mask, thereby forming the source electrode 24a connected to the source region 15a of the active layer 14a through one of the first openings 22a and the drain electrode 24b connected to the drain region 15b of the active layer 14a through another of the first openings 22a. At this time, a portion of the second conductive layer 20c in the capacitor region C is removed using the fourth mask, thereby forming the third opening 22c through which the first conductive layer 18c of the upper electrode 21 is exposed.

Figure 2G:
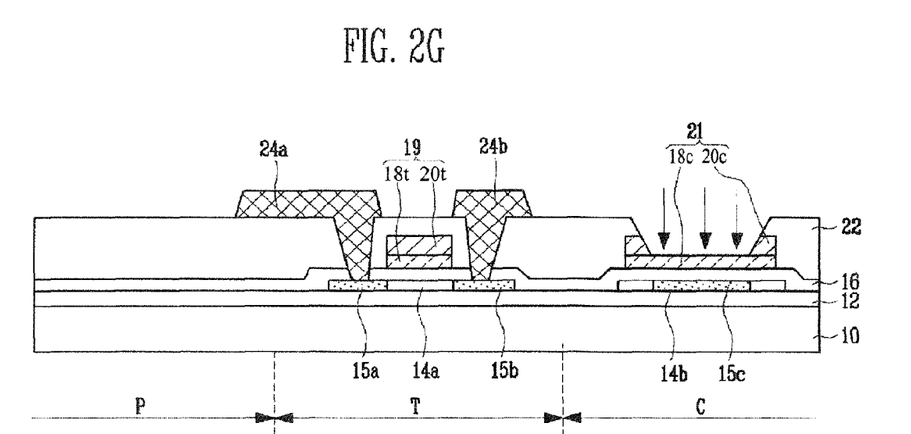

Referring to FIG. 2G, second impurity ions are implanted into the lower electrode 14b through the exposed first conductive layer 18c in the capacitor region C, thereby forming an impurity doping region 15c. The impurity ions are implanted into the lower electrode 14b by passing through the exposed first conductive layer 18c and the gate insulating layer 16. Hence, ion implantation energy is necessarily controlled to have sufficient conductivity.

The impurity ions are implanted into the lower electrode 14b through the first conductive layer 18c made out of an opaque conductive material. However, since the first conductive layer 18c is formed to a thickness of about 200 to 700 Å, there is no difficulty in the impurity implantation process. In this embodiment, the ion-implanted amorphous silicon or poly-silicon is used as the lower electrode 14b of the capacitor Cst, so that the display device can be driven at a low voltage.

Figure 2H:
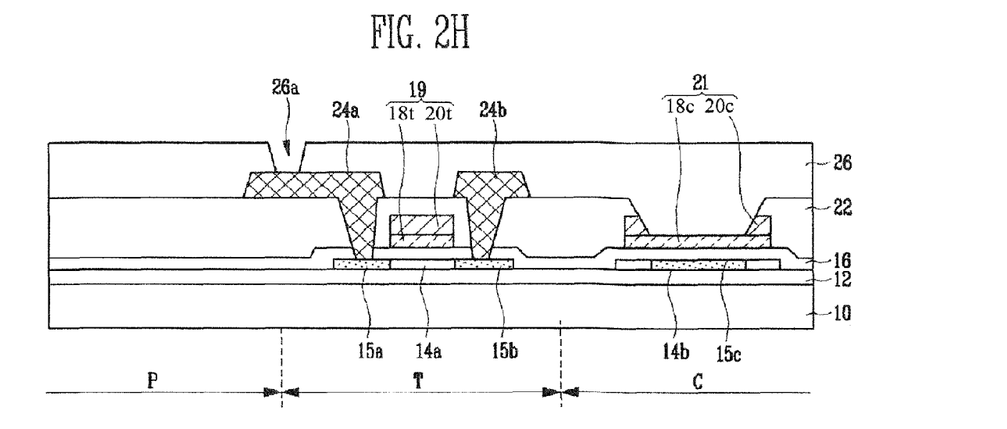

Referring to FIG. 2H, a passivation layer 26 is formed on the substrate 10 on which the source and drain electrodes 24a and 24b are formed, and a fourth opening 26a is then formed through a photolithography process using a fifth mask. The source electrode 24a is exposed through the fourth opening 26a. The passivation layer 26 may be made out of an inorganic insulating layer such as the gate insulating layer 16 or an organic insulating layer such as acryl by a technique such as plasma enhanced chemical vapor deposition (PECVD), spin coating, spinless coating and the like.

Figure 2I:
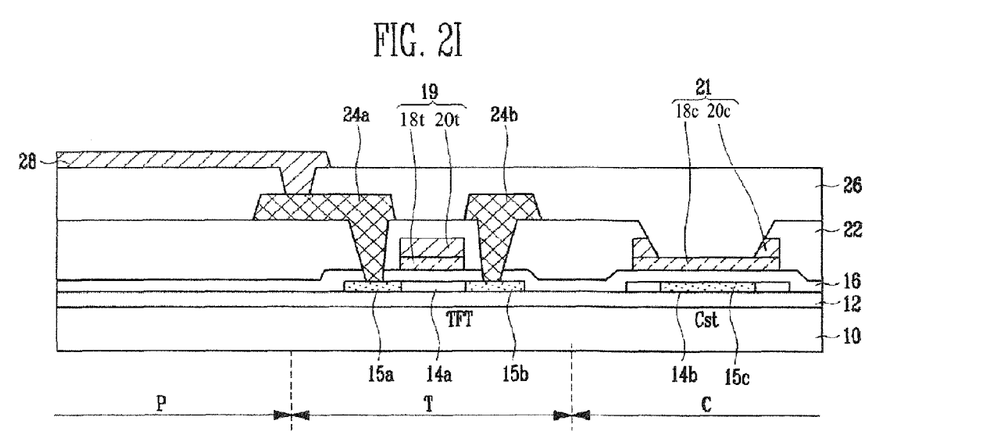

Referring to FIG. 2I, a fourth conductive layer is formed, and an electrode 28 is then produced in the pixel region P through a photolithography process using a sixth mask. The electrode 28 is electrically connected to one of the source and drain electrodes 24a and 24b. When the display device according to the embodiment of the present invention is a liquid crystal display, the electrode 28 is used as a pixel electrode. On the other hand, when the display device according to the embodiment of the present invention is an organic light emitting display device, the electrode 28 is used as an anode or cathode.

As described above, according to this embodiment, a portion of the second conductive layer 20c in the capacitor region C is removed to allow for ion implantation of lower electrode 14b using the same mask that is used to pattern the source and drain electrodes 24a and 24b. Thus, impurity ions can be implanted into the lower electrode 14b without using a separate implantation mask, enabling the silicon lower electrode 14b to have conductivity.

Accordingly, in this embodiment, the number of masks and the number of processes are decreased as compared with those in the related art, thereby reducing manufacturing cost and simplifying processes. Also, the ion-implanted poly-silicon or amorphous silicon is used as the lower electrode of the capacitor, so that the display device can be driven at a low voltage.

In addition, the first conductive layer 18c included in the upper electrode 21 of the capacitor Cst is made out of an opaque conductive layer, so that the upper electrode 21 of the capacitor Cst can be simultaneously formed with the gate line without a separate additional process. Also, the first conductive layers 18t and 18c included in the gate electrode 19 and the upper electrode 21 of the capacitor respectively are made out of an opaque conductive layer, thereby lowering the resistance of the gate electrode 19 and the upper electrode 21 and allowing for a reduced thickness of the second conductive layers 20t and 20c formed on the first conductive layers 18t and 20t respectively.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing a display device, comprising:
   providing a substrate having a transistor region, a pixel region and a capacitor region;
   forming an active layer on the substrate in the transistor region;
   forming a lower electrode on the substrate in the capacitor region;

sequentially forming a gate insulating layer, an opaque first conductive layer and a second conductive layer on the substrate on which the active layer and the lower electrode are formed;

forming a gate electrode and an upper electrode in the transistor region and the capacitor region, respectively, by patterning the first and second conductive layers;

implanting a plurality of first impurity ions into the active region using the gate electrode as a mask;

forming an interlayer insulating layer on an entire surface of the substrate to cover the gate electrode and the upper electrode;

patterning the interlayer insulating layer and portions of the gate insulating layer to expose a portion of the second conductive layer of the upper electrode while simultaneously exposing portions of the active layer at opposite sides of the gate electrode by using a photolithographic technique;

forming a third conductive layer on the patterned interlayer insulating layer;

forming source and drain electrodes electrically connected to the exposed portions of the active layer while simultaneously exposing a portion the first conductive layer that corresponds to the exposed portion of the second conductive layer by etching, via a photolighography technique, portions of the third conductive layer and the exposed portion of the second conductive layer; and implanting second impurity ions into the lower electrode through the exposed portion of the first conductive layer.

2. The method according to claim 1, wherein the lower electrode is comprised of a material selected from a group consisting of amorphous silicon and poly-silicon.

3. The method according to claim 1, wherein the first conductive layer of the upper electrode has a thickness of about 200 to 700 Å.

4. The method according to claim 1, wherein the first conductive layer of the upper electrode includes a material selected from a group consisting of chromium and molybdenum.

5. The method according to claim 1, wherein, in the removing of the exposed portion of the second conductive layer, portions of the second conductive layer of the upper electrode remain at edges of the first conductive layer of the upper electrode.

6. The method according to claim 1, wherein the second conductive layer of the upper electrode includes a material selected from a group consisting of a metal and a metal alloy.

7. The method according to claim 1, wherein the upper electrode is arranged on a same layer as the gate electrode.

8. A method of manufacturing a display device, comprising:

providing a substrate having a pixel region, a transistor region and a capacitor region;

forming a silicon layer on an entire surface of the substrate, the silicon layer including a material selected from a group consisting of poly-silicon and amorphous silicon;

forming an active layer and a lower electrode in the transistor region and the capacitor region, respectively, by patterning the silicon layer using a first mask;

sequentially forming a gate insulating layer, an opaque first conductive layer and a second conductive layer on the substrate on which the active layer and the lower electrode are formed;

forming a gate electrode and an upper electrode in the transistor region and the capacitor region, respectively, by patterning the first and second conductive layers using a second mask;

implanting a plurality of first impurity ions into portions of the active layer;

forming an interlayer insulating layer on an entire surface of the substrate;

exposing portions of the active layer implanted with the first impurity ions while exposing a portion of the second conductive layer of the upper electrode by patterning the interlayer insulating layer and the gate insulating layer using a third mask via a photolithographic technique;

forming a third conductive layer on the patterned interlayer insulating layer;

forming source and drain electrodes electrically connected to the exposed portions of the active layer while simultaneously exposing a portion of the first conductive layer of the upper electrode by patterning the third conductive layer while removing the previously exposed portion of the second conductive layer via a photolithographic technique using a fourth mask; and implanting a plurality of second impurity ions into the lower electrode through the exposed portion of the first conductive layer.

9. The method according to claim 8, wherein the first conductive layer of the upper electrode has a thickness of about 200 to 700 Å.

10. The method according to claim 8, wherein the first conductive layer of the upper electrode includes a material selected from a group consisting of chromium and molybdenum.

11. The method according to claim 8, wherein the gate electrode and the upper electrode are comprised of a same material and are arranged on a same layer as a gate line.

12. The method of claim 1, wherein each of the upper electrode and the gate electrode are both arranged directly on the gate insulating layer.

13. The method of claim 12, wherein each of the upper electrode and the gate electrode are both comprised of same materials, and are both produced at a same time.

14. The method of claim 1, wherein the lower electrode of a capacitor within the capacitor region is arranged directly on a same layer and is comprised of a same material as the active layer of a transistor within the transistor region.

15. The method of claim 1, further comprising a transistor arranged within the transistor region, the transistor comprises:
the gate electrode;
the active layer that is comprised of either amorphous silicon or polysilicon; and
the gate insulating layer that is interposed between the gate electrode and the active layer.

16. The method of claim 8, further comprising:
a transistor arranged within the transistor region of the substrate and including the gate insulating layer interposed between the gate electrode and the active layer; and
a capacitor arranged within the capacitor region of the substrate, wherein the capacitor comprises:
the lower electrode arranged directly on a same layer and being comprised of a same material as the active layer of the transistor; and
the upper electrode including the first conductive layer and the second conductive layer arranged on the first conductive layer, wherein the upper electrode is arranged directly on a same layer and being comprised of same materials as the gate electrode of the transistor, wherein the gate insulating layer is also interposed between the upper electrode and the lower electrode, wherein the second conductive layer of the upper electrode is arranged only on edge portions of the first conductive layer of the upper electrode.

17. The method of claim 16, wherein the gate electrode is comprised of the first conductive layer and the second conductive layer arranged on the first conductive layer, the first conductive layer being opaque and having a thickness in the range of about 200 to 700 Å.

18. The method of claim 17, wherein the exposing of the first conductive layer of the upper electrode produces an opening arranged within the second conductive layer of the upper electrode of the capacitor, wherein the first conductive layer of the upper electrode and the lower electrode of the capacitor are doped with a same impurity, the first conductive layer being comprised of at least one of chromium and molybdenum.

19. The method of claim 16, further comprising:
a passivation layer arranged on the source and drain electrodes, and
a pixel electrode arranged on the passivation layer and being electrically connected to one of the source and drain electrodes through an aperture in the passivation layer, wherein the interlayer insulating layer is arranged on the gate electrode and the upper electrode, and
wherein the source and drain electrodes are arranged on the interlayer insulating layer, the source and drain electrodes being electrically connected to source and drain regions respectively of the active layer through the exposed portions of the active layer.

20. The method of claim 18, further comprising:
a passivation layer arranged on the source and drain electrodes; and
a pixel electrode arranged on the passivation layer and being electrically connected to one of the source and drain electrodes through an aperture in the passivation layer, and
wherein the interlayer insulating layer is arranged on the gate electrode and the upper electrode, and
wherein the source and drain electrodes are arranged on the interlayer insulating layer, the source and drain electrodes being electrically connected to source and drain regions respectively of the active layer through the exposed portions of the active layer.

* * * * *